United States Patent [19]
Rosich et al.

[11] Patent Number: 5,587,964
[45] Date of Patent: Dec. 24, 1996

[54] PAGE MODE AND NIBBLE MODE DRAM

[75] Inventors: Mitchell N. Rosich, Groton, Mass.; William L. Lippitt, Cumbuland, R.I.

[73] Assignee: Digital Equipment Corporation, Maynard, Mass.

[21] Appl. No.: 625,990

[22] Filed: Apr. 1, 1996

Related U.S. Application Data

[63] Continuation of Ser. No. 417,712, Apr. 6, 1995, abandoned, which is a continuation of Ser. No. 317,413, Oct. 3, 1994, abandoned, which is a continuation of Ser. No. 176,294, Jan. 3, 1994, abandoned, which is a continuation of Ser. No. 722,697, Jun. 28, 1991, abandoned.

[51] Int. Cl.$^6$ .................................................... G11C 7/00
[52] U.S. Cl. ...................... 365/238.5; 365/221; 365/236
[58] Field of Search .................................... 365/221, 233, 365/235, 236, 238.5

[56] References Cited

U.S. PATENT DOCUMENTS

| | | | |
|---|---|---|---|
| 4,575,825 | 3/1986 | Ozaki et al. | 365/189 |
| 4,586,167 | 4/1986 | Fujishima et al. | 365/238.5 |
| 4,672,582 | 6/1987 | Nishimura et al. | 365/230.03 |
| 4,833,650 | 5/1989 | Hirayama et al. | 365/225.7 |
| 4,876,671 | 10/1989 | Norwood et al. | 365/233 |
| 5,088,062 | 2/1992 | Shikata | 365/189.05 |

*Primary Examiner*—Terry Cunningham
*Attorney, Agent, or Firm*—Lindsay G. McGuinness; Denis G. Maloney; Arthur W. Fisher

[57] ABSTRACT

A page mode/nibble mode dynamic random access memory (DRAM) comprising row and column decoders, the column decoder further comprising a column address buffer and a column address buffer counter. The page mode/nibble mode DRAM also comprises a buffer controller means adapted to receive a write enable signal and to determine whether the DRAM should be placed in a page mode or a nibble mode to facilitate the particular memory access requested by a memory controller. An asserted write enable signal, may indicate, for example, a write operation, thereby calling for the page mode/nibble mode DRAM to move into a page mode to effectuate the write operation. The page mode/nibble mode DRAM also utilizes the write enable signal in the conventional manner, to indicate the initiation of a particular type of memory access, namely a write operation or a read operation.

10 Claims, 9 Drawing Sheets

FIG. 1
PRIOR ART
NIBBLE MODE

FIG. 2 PRIOR ART PAGE MODE

FIG. 3
PRIOR ART
NIBBLE MODE

FIG. 4
PRIOR ART
PAGE MODE

FIG. 5
PAGE MODE / NIBBLE MODE

FIG. 5A
PAGE MODE / NIBBLE MODE

FIG. 6
PAGE MODE / NIBBLE MODE

FIG. 7
PAGE MODE/NIBBLE MODE

FIG. 7A
PAGE MODE/NIBBLE MODE

PAGE MODE AND NIBBLE MODE DRAM

This application is a continuation of application Ser. No. 08/417,712, filed Apr. 6, 1995, now abandoned, which was a continuation of application Ser. No. 08/317,413, filed Oct. 3, 1994, now abandoned, which is a continuation of application Ser. No. 08/176,294, filed Jan. 3, 1994, now abandoned, which is a continuation of application Ser. No. 07/722,697, filed Jun. 28, 1991, now abandoned.

FIELD OF THE INVENTION

This invention relates to Dynamic Random Access Memories (DRAMs). More particularly, it relates to a single DRAM unit having both a page mode (optimally for "writing") and a nibble mode (optimally for "reading") memory access capability.

BACKGROUND OF THE INVENTION

It is a general design goal for computer system component designers to reduce the complexity of memory controllers while increasing memory throughput. Computer systems may become memory-access-limited if the typical CPU cycle time is greater than an order of magnitude faster than the cycle time of the main memory components such as DRAMs. Recent attempts by DRAM manufacturers to reduce memory access time and component latency include the implementation of page mode and nibble mode features (as described infra) to these devices. These features have proven useful for decreasing necessary access time when the data being sought are in locations proximate to each other, i.e., when the addresses for consecutive data accesses are found relatively close to one another in physical memory.

DRAM's are typically addressed by a bit pattern of a predetermined length which is dependent upon DRAM size. For example, a one megabit DRAM would require a minimum of 20 bits to address every memory location ($2^2$=1,048,576). Of these 20 bits, typically 10 are for the row address and the remaining 10 are for the column address of the memory location of the DRAM. In operation, however, memory addresses frequently comprise more than these 20 minimum bits to address the DRAM array locations. For example, additional bits may be required for choosing the particular DRAMs to be accessed.

In operation, a conventional DRAM has the portion of the DRAM address dedicated to row identification (for example, 10 bits of the 20 bits described above) input to a row address decoder, usually upon receipt of a row access strobe (RAS) signal on the appropriate signal line. The portion of the DRAM address dedicated to column identification is input to a column address decoder, usually upon receipt of a column address strobe (CAS) signal on another input line.

Generally, memory access to a DRAM unit can be viewed as comprising up to seven stages, with each stage requiring a specific time period. Specifically, there is the RAM select stage during which the particular memory unit to be accessed is chosen; a row address set-up stage which corresponds to the length of time that a specific row address must be stable prior to the RAS strobe; the RAS stage to strobe the row address to a row address decoder; the column address set-up stage which corresponds to the length of time that a specific column address must be stable prior to the CAS strobe; the CAS stage to strobe the column address to a column address decoder; the data slot stage, during which data located in the addressed location is retrieved or deposited; and an address release stage which frees the system for receipt of the next address.

In DRAM implementation the column address set-up stage requires a significant amount of time compared to the other six stages. For example, in a typical memory access to a DRAM using the seven stages just discussed, 85–100 nanoseconds may be needed to complete the middle five stages of the access. Of this total time, the column address set-up alone may take 30 nanoseconds. Eliminating, or at least reducing the column address set-up time would improve memory access time.

The nibble mode may be generally defined as operating with a common row address and an incremental column address. The operation of a DRAM in this manner is useful for memory accesses when the data sought is at consecutive addresses in memory. This mode allows for a new memory address to be provided to the DRAM on the initial RAS and CAS cycles. A DRAM operating in the nibble mode contains an internal incremental counter which increments the column address by one for each CAS cycle with wrap around, for example, a 2 bit counter would allow four consecutive address accesses. Such an arrangement eliminates the column address set-up time for all but the initial CAS cycle, and therefore memory access time is significantly reduced.

A DRAM having nibble mode capability is especially useful for reading program instructions from memory since such instructions tend to reside in consecutive memory locations. In the case of cache memory devices, nibble mode-capable DRAMs are useful for cache fills during read operations which often require fill sizes greater than one word, with such fill locations typically occurring consecutively. Nibble mode DRAMs are beneficial for read operations because of the tendency for reads to retrieve blocks of data as opposed to write operations which typically deposit data in non-consecutive locations in memory.

In turn, page made may be generally defined as operating with a common row address and a varying column address. A DRAM having page mode capability is useful for memory accesses which have the same row addresses but different column addresses. The operation of a page mode DRAM provides for the input of a single row address and unique column addresses for each CAS cycle until the RAS signal changes state. Page mode operations require more time than nibble mode operations since there is a column set-up time at each cycle. However, page mode operations are more useful over a wider data set than nibble mode operations, since it can be used for all data on the same page without being limited to consecutive data elements.

Heretofore it was necessary to choose between nibble mode and page mode operations in an attempt to optimize a particular memory subsystem for reads or writes. This, however, helped only if you made the right choice for the particular type of operations most likely to be run on the system. If the wrong choice was made, the user saw no memory access time advantage, and in fact the memory access time could have become worse.

In their attempts to come up with DRAM designs to reduce memory access time, manufacturers have been frustrated by the inability to modify standard DRAM inputs and signal connections (so called "DRAM footprints"). That is, any gains in DRAM memory access time came at the expense of more complicated, pin designs or hardware and software of greater complexity.

SUMMARY OF THE INVENTION

A DRAM according to the present invention includes a storage cell arranged in an array of rows and columns, a row address decoder which is strobed by a RAS signal to place a first predetermined portion of the memory address into the storage cell, a column address decoder which is strobed by a CAS signal to place a second predetermined portion of the memory address into the cell, means for selecting the read or write mode, and buffer controller means for determining page mode or nibble mode operation of the DRAM. The means for selecting the read or write mode and buffer controller means are adapted to receive a write enable ("WE") signal and to select the read or write mode, respectively, and determine the page or nibble mode based on the state of the WE signal.

This page mode/nibble mode DRAM of the present invention maintains a standard DRAM footprint and utilizes an existing signal input, the WE signal, to facilitate the initiation of the mode of operation that is suitable for the type of memory access that is required. For example, if the DRAM receives an asserted WE signal, indicating a write operation prior to the assertion of CAS, the page mode/nibble mode DRAM will react by ensuring that the DRAM is in page mode to facilitate the write operation.

The page mode/nibble mode DRAM of the present invention, as stated, has a buffer controller means coupled to the column address decoder. The column address decoder comprises a column address buffer and a column address buffer counter, with the latter being adapted to receive at least the CAS signal to facilitate incrementing the second predetermined portion (column address) of the memory address. The column address buffer counter also receives a counter enable signal to initiate the incrementing of the column address.

The buffer controller means is adapted to determine the first CAS signal in a memory address cycle and uses the RAS signal as the signal to clear the buffer controller means. The CAS signal and a WE signal are also inputs to the buffer controller means. The CAS signal is used to clock the buffer controller means and the WE signal is an input, the logic state of which is predetermined to correspond to either a read mode or a write mode. The WE signal is monitored by the buffer controller means and its logic state affects the assertion or deassertion of the counter enable signal upon the clocking by the CAS signal.

The page mode/nibble mode DRAM of the present invention is adapted to operate in a sequence of stages to decrease memory access time.

DETAILED DESCRIPTION OF THE PREFERRED EMBODIMENT

Figure 1:
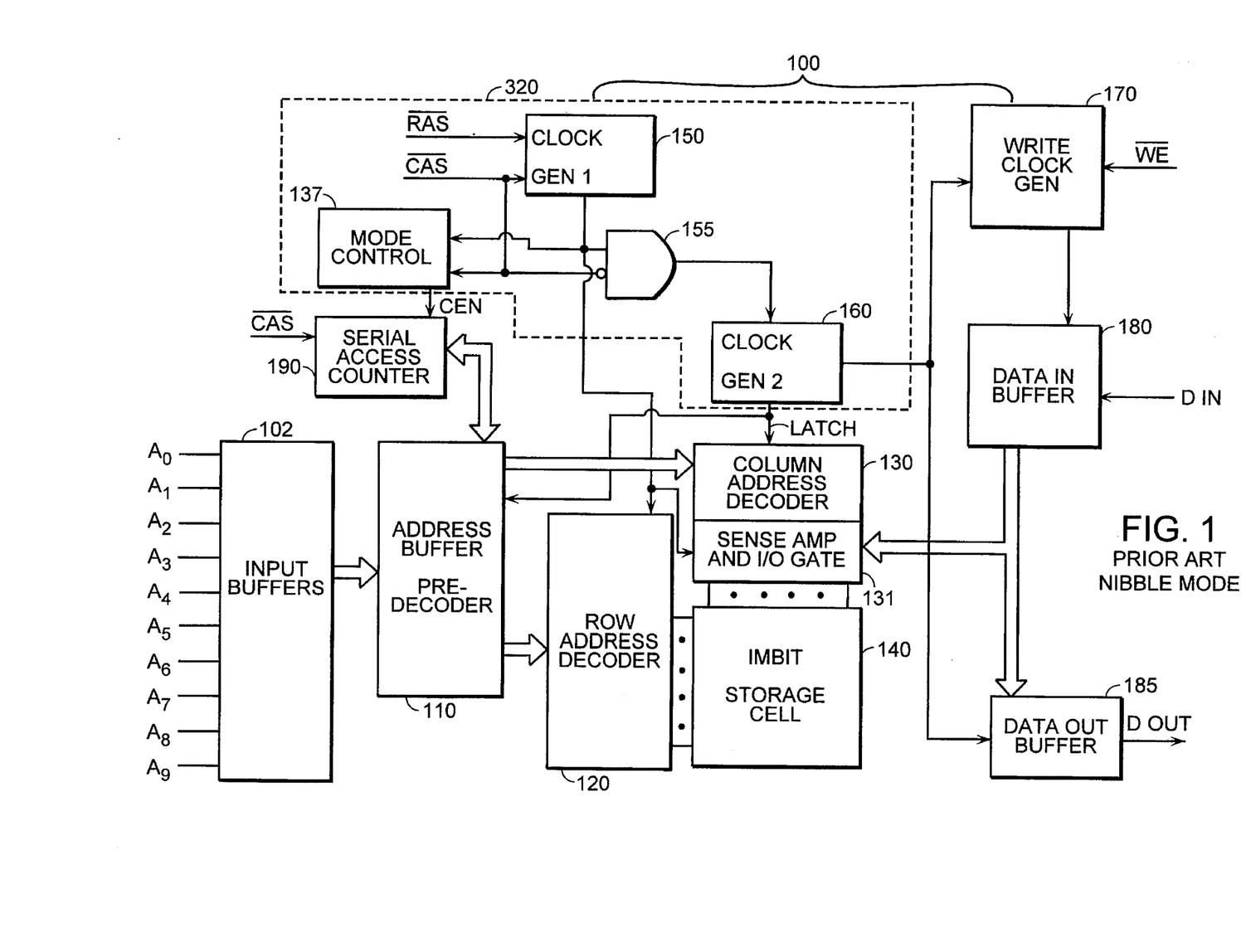
FIG. 1 is an illustration of a prior art nibble mode DRAM.

Referring to FIG. 1, an illustration of a prior art nibble mode one megabit DRAM is shown generally at 100. The DRAM has input buffers 102 that receive a memory address, which may be multiplexed, on receiving lines $A_0$ through $A_9$. The memory address includes at least a row address element and a column address element which is input to an address buffer pre-decoder 110. The row address is then sent to a row address decoder 120 and latched with the assertion of RAS (not shown). The column address is sent to a column address decoder 130 and latched with the assertion of CAS (not shown). The decoded row and column addresses then uniquely select one location in a storage cell 140.

Data can be written to or retrieved from the storage cell 140 through data-in and data-out-buffers, (180 and 185, respectively, which are each coupled to a sense amp and I/O gate 131, a device acting as an access interface with the storage cell 140.

The row address decoder 120 receives a clock signal from a clock generator 150 to strobe it. The inputs to the clock generator 150 are logical complements of the RAS and CAS signals. Similarly, the column address decoder 130 receives a signal (LATCH) from a clock generator 160 to strobe it. The input to clock generator 160 is the output of AND gate 155. The inputs to gate 155 are the CAS signals and the output of the clock generator 150. The mode control 187 is adapted to output a CEN (counter enable) signal dependent on the state of the CAS signal, along with the output of clock generator 150 which is input to the mode control 187.

The prior art nibble mode DRAM of FIG. 1 also comprises a write clock generator 170 which receives a WE signal and a clock signal from clock generator 160. The output of the write clock generator clocks the data-in-buffer 180. A clock signal from clock generator 160 clocks the data-out-buffer 185. In addition, the write clock generator 170 comprises means to select between a write mode and a read mode based on the state of the WE signal. An asserted WE signal may, for example, indicate a write mode, and a deasserted WE signal may indicate a read mode. This will indicate whether the write clock generator 170 will enable the data-in-buffer 180. This is a basic function of all DRAMS.

The nibble mode DRAM of FIG. 1 also includes a serial access counter 190 which, independent of whether the DRAM is in a read mode or a write mode, will track the address bits (column addresses) in the address buffer pre-decoder 110 on the first column access and increment the column address for subsequent accesses within the same row by assertion of the CAS signal.

Figure 2:
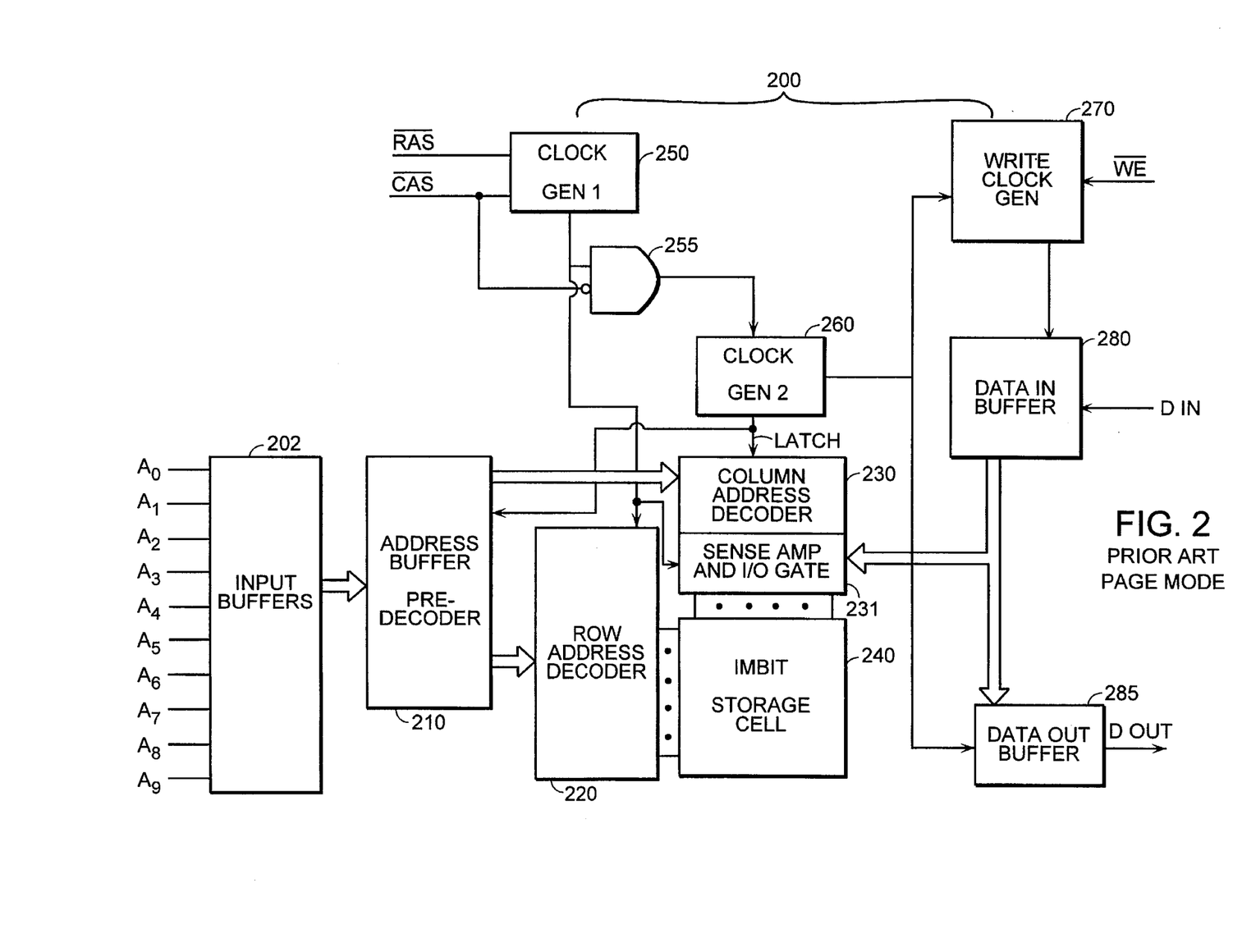
FIG. 2 is an illustration of a prior art page mode DRAM.

Referring now to FIG. 2, an illustration of a prior art page mode DRAM is shown generally at 200. This device has a configuration similar to that of the nibble mode DRAM shown in FIG. 1. The DRAM 200 has input buffers 202 for receiving memory address signals, which may be multiplexed, on lines $A_0$ and $A_9$. The memory address signals are received by an address buffer predecoder 210 and may comprise at least a row address element and a column address element.

The row address element is sent to a row address decoder 220 and latched with the assertion of RAS (not shown). The column address is sent to a column address decoder 230, and latched with the assertion of CAS (not shown). The row and column addresses then uniquely select one location in the storage cell 240.

Data can be written to or retrieved from the storage cell 240 through data-in and data-out-buffers, respectively (280 and 285, respectively) which are each coupled to a sense amp and I/O gate 231, a device acting as an access interface with the storage cell 240.

The row address decoder 220 receives a signal from clock generator 250 to store the row address. The inputs to the clock generator 250 are the logical complement of the RAS and CAS signals.

The column address decoder 230 receives a clock signal from a clock generator 260 to store the column address. The input to the clock generator 260 is the output of AND gate 255 whose inputs are the CAS signal and the output of clock generator 250.

The prior art page mode DRAM of FIG. 2 also comprises a write clock generator 270 which receives a WE signal and enables a data-in-buffer 280. This device operates in accordance with the write clock generator 170 shown in FIG. 1 and described previously. The page mode DRAM differs from the nibble mode DRAM of FIG. 1 in that it does not include a serial access counter and mode control.

Figure 3:
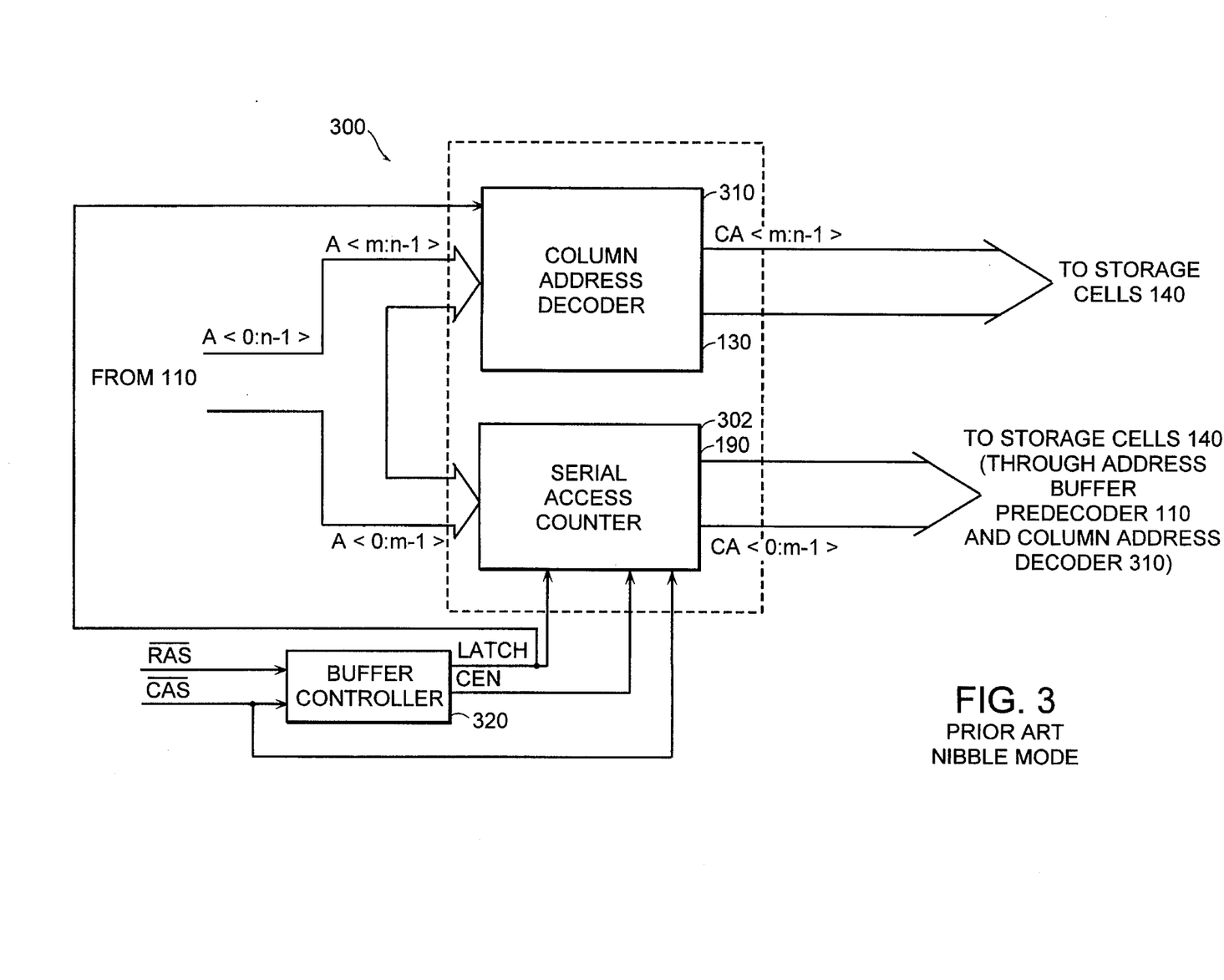
FIG. 3 is a block diagram of a portion of a prior art nibble mode DRAM with buffer controller.

FIG. 3 illustrates the functions performed by the column address decoder 130, and a block diagram of the serial acess counter 190 of the prior art nibble mode DRAM shown in FIG. 1, along with the components which comprise the buffer controller of the prior art. According to FIG. 3, the memory address A<0:n–1> includes a first element A<0:m–1> which is offered by a serial access counter 302, and a second element A<m:n–1> which is altered by a column address decoder 310. The column address decoder 310 provides a portion of the column address CA<m:n–1> while the serial access counter 302 provides another portion of the column address, CA<0:m–1>.

In the nibble mode arrangement, the serial access counter 302 receives as inputs the CAS signal, a CAS signal (not shown) and a CEN (counter enable) signal. The column address decoder 310 also receives as input the LATCH signal (not shown). The LATCH signal is output from a buffer controller device 320. This buffer controller device 320 comprises mode control 187, gate 155, clock generator 150 and clock generator 160 shown in FIG. 1. The inputs to the buffer controller device 320 are the RAS signal and the CAS signal.

Figure 4:
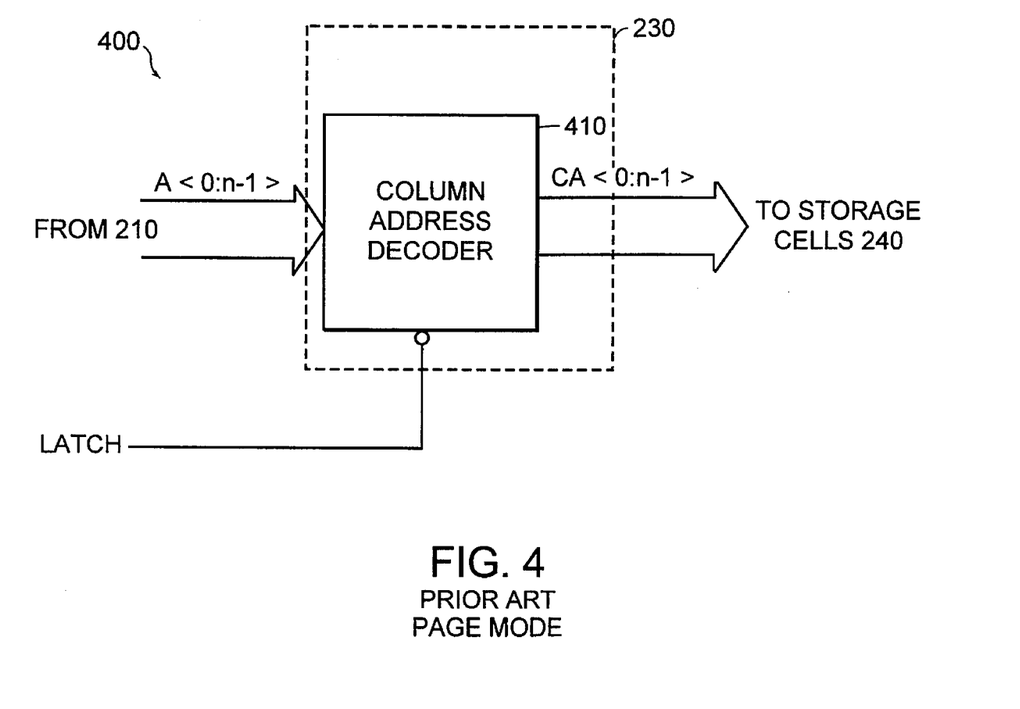
FIG. 4 is a block diagram of a portion of a prior art page mode DRAM.

Referring now to FIG. 4, a block diagram is shown of the column address decoder 230 of the prior art page mode DRAM of FIG. 2. This illustrated portion includes the memory address A<0:n–1> which is an input to a column address decoder 410. The resulting output of the decoder 410 (being column address CA<0:n–1>) is latched when the column address decoder 410 is clocked by an asserted LATCH signal. When the LATCH signal is deasserted, the column address is again allowed to flow unimpeded through the column address decoder 410.

The differences between the illustrations shown in FIGS. 3 and 4 stem from the need, in a nibble mode DRAM, to provide an internal wrap-around counter to increment the initial column address by one at each CAS cycle. When a wrap-around counter reaches its predetermined maximum value, it will return to zero and resume incrementing.

Figure 5:
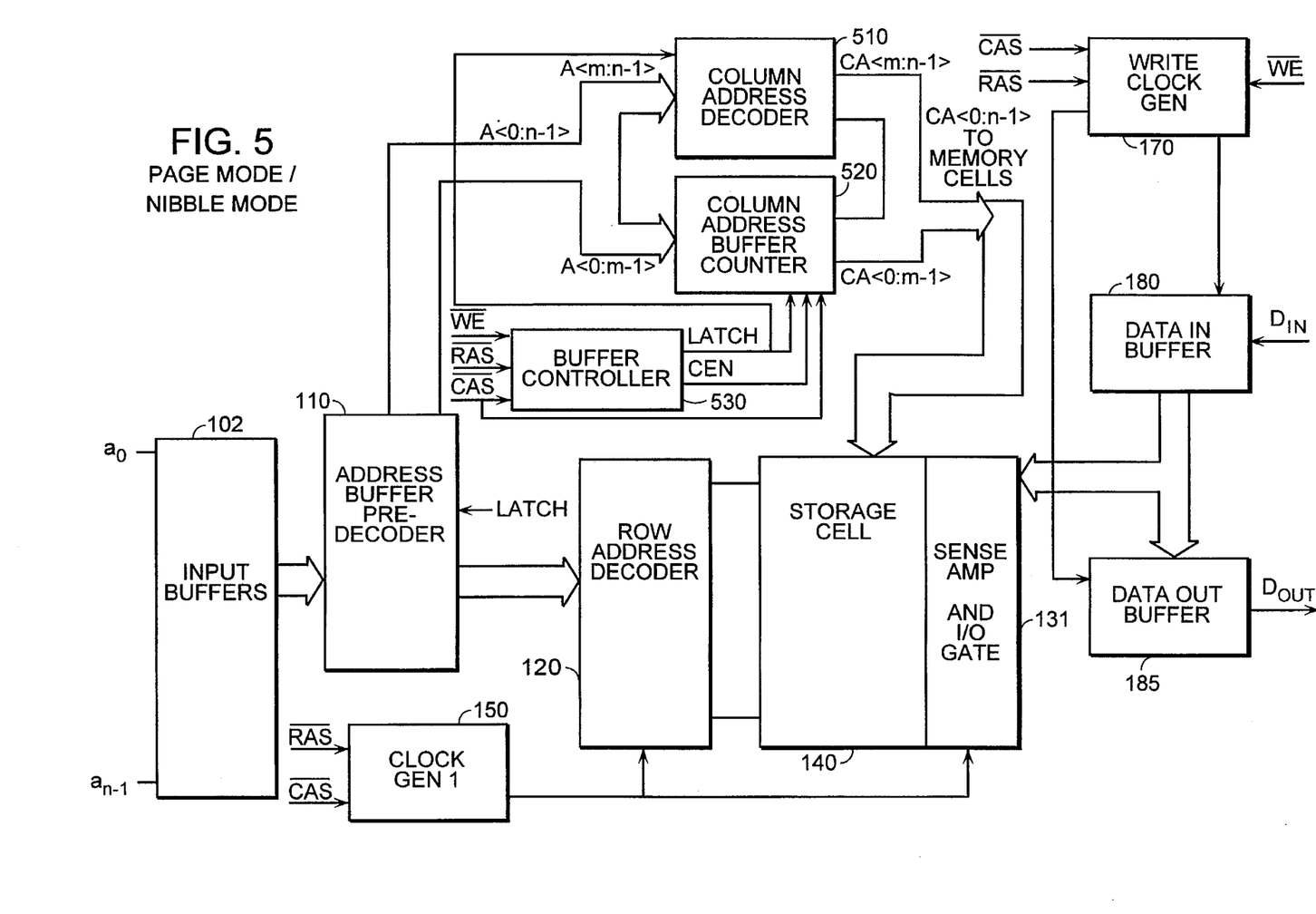
FIG. 5 is a block diagram of a page mode/nibble mode DRAM with buffer controller in accordance with the present invention.
Figure 5A:
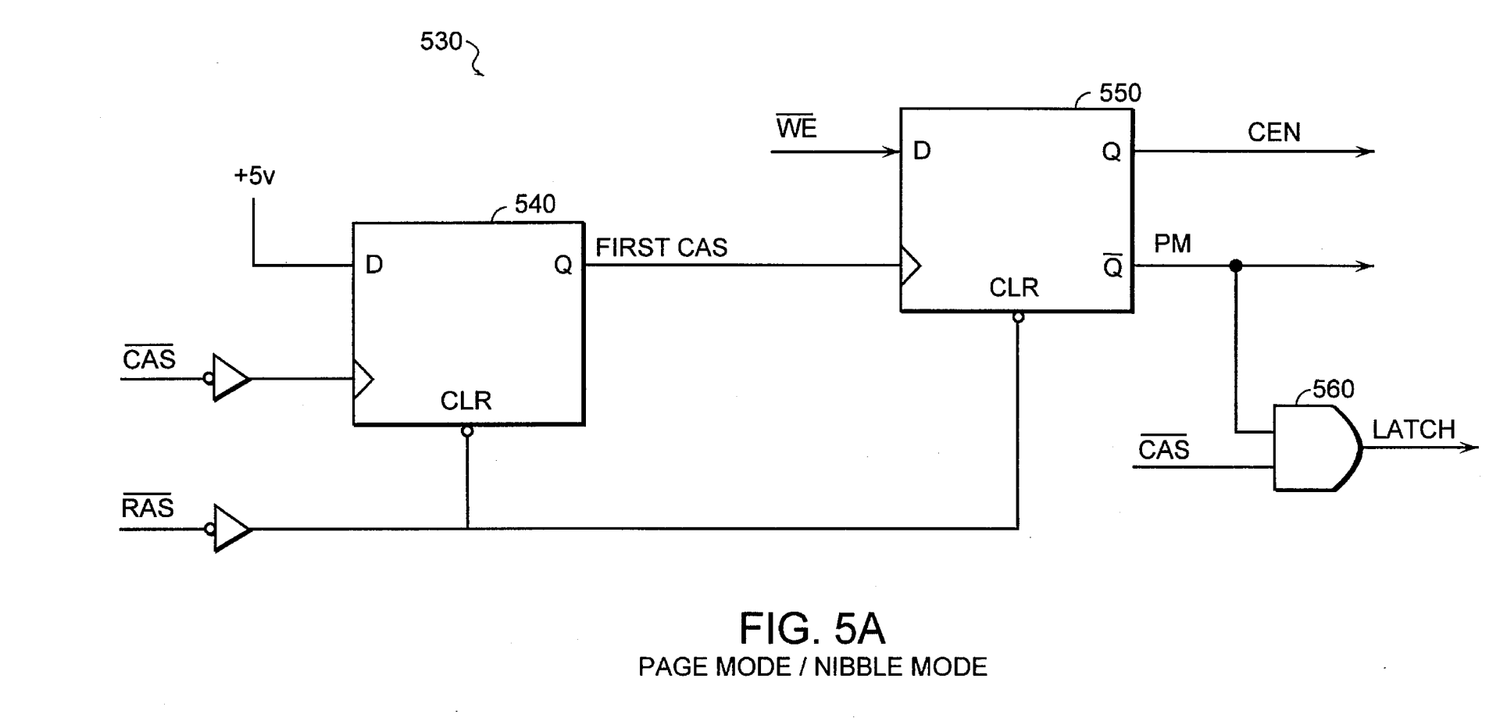
FIG. 5A is a block diagram of the DRAM buffer controller device in the present DRAM invention.

FIG. 5 is a block diagram of a combined page mode/ nibble mode DRAM with buffer controller according to the present invention. FIG. 5A is a block diagram of buffer controller 530. In the illustrated embodiment, a memory address A<0:n–1> is divided such that a first portion A<m:n–1> is input into a column address decoder 510, and a second portion A<0:m–1> is input into a column address buffer counter 520. The other inputs to the column address buffer counter 520 are a LATCH signal, and a counter enable (CEN) signal and the complement of the CAS signal. In addition the column address decoder 510 receives as input the LATCH signal. The LATCH signal and CEN signal are output from a buffer controller device 530. The inputs to the buffer controller device 530 are the compliments of the CAS signal, the RAS signal and a WE signal. The DRAM further has input buffers 102 that receive a memory address, which may be multiplexed, on receiving lines A0 through $A_{n-1}$. The memory address includes at least a row address element and a column address element which is input to an address buffer pre-decoder 110. The row address is then sent to a row address decoder 120 and latched with the assertion of RAS. Data can be written to or retrieved from the storage cell 140 through data-in and data-out buffers respectively 180 and 185 which are each coupled to a sense amp 131 and controlled by Write Clock Gen 170.

The page mode/nibble mode DRAM also includes means for selecting between a read mode and write mode. The means for selecting between modes is implemented in the identical manner to that described above in respect of the write clock generators 170 and 270 (FIGS. 1 and 2).

The page mode/nibble mode DRAM of the present invention uses the WE signal in two ways. The DRAM first initiates an appropriate change to either a read or write mode, depending upon whether the WE signal is asserted or deasserted. The DRAM will also initiate a mode change, for example, from page mode to nibble mode depending upon the state of the WE signal at the first CAS assertion after RAS assertion. Accordingly, when a signal indicative of a write signal is received by the page mode/nibble mode DRAM of the present invention on the WE signal line coincident with the first assertion of CAS after RAS assertion, the DRAM will react by ensuring that the DRAM is placed in the page mode. This use of the WE signal for the purpose of switching between page mode and nibble mode operations was not done in the prior art DRAM. As such, when the page mode/nibble mode DRAM receives a write signal (for example, when the write enable signal is asserted coincident with the first assertion of CAS after RAS assertion), the device is equipped to switch to a write mode, and also place itself in the page mode to facilitate the impending write operation. Conversely, when the page mode/nibble mode DRAM receives a read signal (for example, when the WE signal is deasserted coincident with the first assertion of CAS after RAS assertion), the device places itself in a read mode and invokes a nibble mode operating status to facilitate the impending read operation.

Once the initial CAS assertion after RAS assertion has selected either page or nibble mode, based on the state of the WE signal, all subsequent cycles within the same RAS assertion are executed in the selected mode. For example, nibble mode writes can be achieved by not asserting the WE signal until after the first CAS assertion.

Referring now to FIG. 5A, a detailed illustration of the buffer controller device 530 of the page mode/nibble mode DRAM of the present invention is shown. The buffer controller device 530 comprises first and second flip-flops 540 and 550, respectively which may be "D" type flip-flop, or other equivalent bistable elements. The first flip-flop 540 is coupled to a logical high source, for example a 5 volt source. The first flip-flop 540 is clocked by the assertion of the CAS signal, and may be reset by the deassertion of the RAS signal received at the negative-true CLR input (for clearing the flip-flop device). The output of the first flip-flop is designated the FIRST CAS signal.

The buffer controller device 530 also includes a second flip-flop 550 which is clocked by the output FIRST CAS of the first flip-flop 540 and may be reset by the deassertion of the RAS signal received at the negative-true CLR input (for clearing the flip-flop device). The output FIRST CAS of the first flip-flop 540 also serves to indicate the first CAS signal received by the buffer controller device 530 for each memory address received by the page mode/nibble mode DRAM. For each instance of RAS deassertion the FIRST CAS signal is deasserted ("0"). The first assertion of CAS, after the assertion of RAS, clocks the logical high source value to the Q output of the first flip-flop 540. This results in the FIRST CAS signal becoming asserted ("1"). Each subsequent clocking of the first flip-flop 540 (by a CAS assertion) will simply continue to place an asserted signal on the FIRST CAS signal line until the first flip-flop 540 is cleared by a RAS deassertion.

The second flip-flop 550 also receives the logical complement of the WE signal as an input.

The first output of the second flip-flop 550 is the counter enable (CEN) signal indicative of a nibble mode operation. This is the only mode in which the counter is needed to increment the column address with successive CAS cycles. The second output is a PM signal, indicative of a page mode operation. The PM signal is then input into AND gate 560. The second input to the AND gate is the logical complement of the CAS signal. The output of the AND gate is the LATCH signal so that LATCH is asserted when the column is ready to be held by the column address decoder and column address buffer counter.

The arrangement illustrated in FIG. 5 and FIG. 5A is adapted to accept and react to a logical low level (assertion low). Specifically, when, for example, the column address strobe (CAS) signal goes low, the strobing of the column address is triggered in the DRAM. The arrangement of FIGS. 5 and 5A can easily be adapted to operate and trigger on logical high signals (assertion high).

Figure 6:
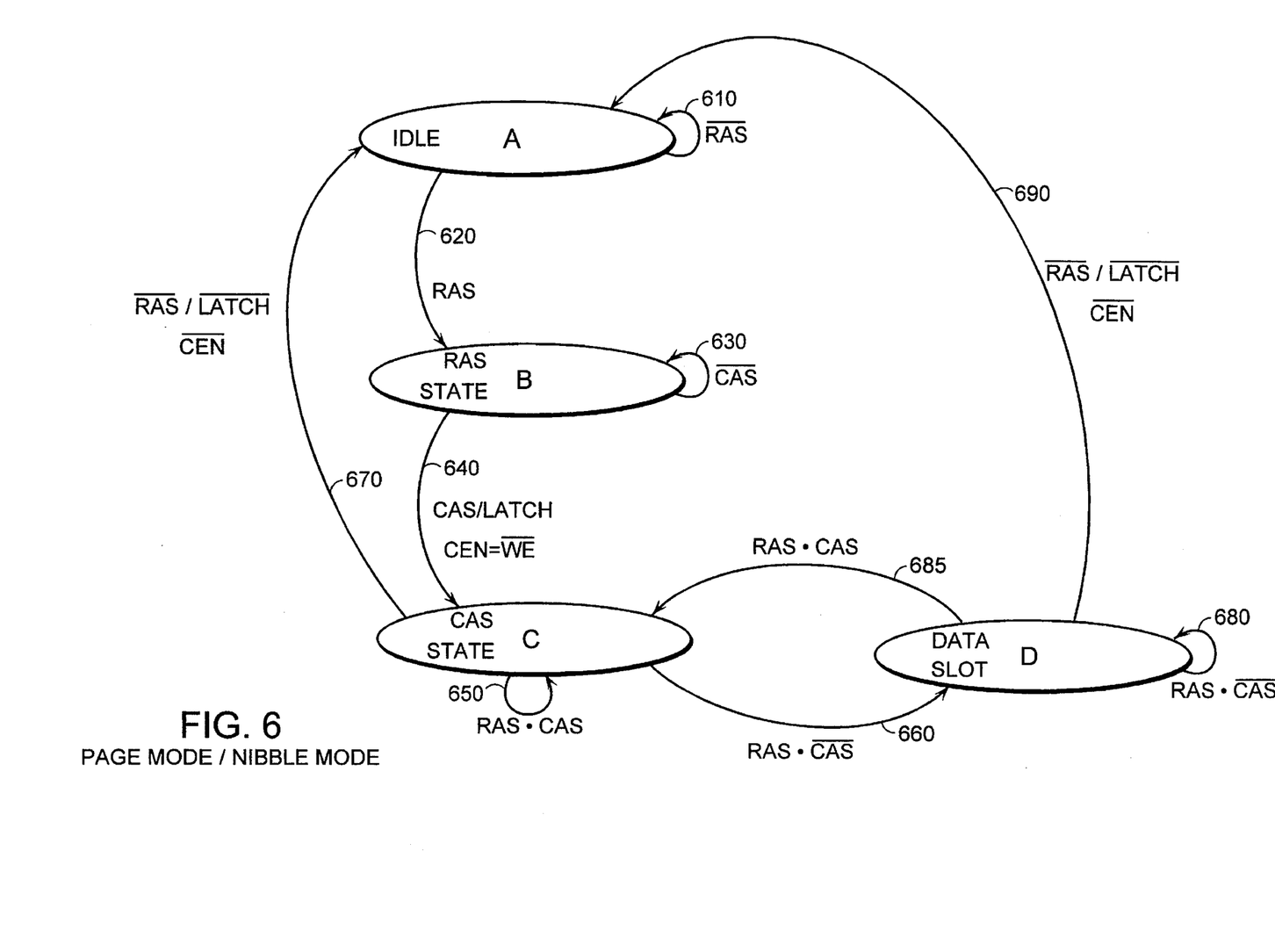
FIG. 6 is a state diagram for a page mode/nibble mode DRAM of the present invention.

The operation of the page mode/nibble mode DRAM of the present invention can be described using the illustration of a state diagram as appears in FIG. 6. This state diagram contains four states, A, B, C, and D. State A represents the Idle state in which the buffer controller will remain as long as the RAS signal is deasserted, as indicated by state loop 610. If however, the RAS signal is asserted to the page mode/nibble mode DRAM of the present invention, indicative of a row address being loaded in a row decoder, for example, the row decoders 120, 220 of FIGS. 1 and 2, respectively, the buffer controller will move to state B, as indicated by state line 620.

State B represents the RAS state, in which the row address is strobed to a row address decoder or buffer. The page mode/nibble mode DRAM buffer controller will remain in the RAS state for as long as the CAS signal is deasserted, as indicated by state loop 630, which depicts the deassertion of the CAS signal as the logical complement thereof. If, however, the CAS signal is asserted the DRAM buffer controller will move to state C and the output of the buffer controller device 530 will include an asserted LATCH signal, as indicated by state line 640. If the WE signal is deasserted, the output of buffer controller device 530 will include an asserted counter enable (CEN) signal as well.

State C represents the CAS state, in which the column address is strobed to a column address decoder and column address buffer counter shown at FIG. 5 at 510 and 520. It should be noted that the Column Address CA<0:n−1> is held stable once CAS is first asserted during nibble mode cycles. The page mode/nibble mode DRAM will remain in state C for as long as the CAS and RAS signals are asserted, as indicated by state loop 650. If however, the CAS signal deasserts and RAS remains asserted, the buffer controller will move to state D, as indicated by state line 660. However, the buffer controller will move from state C to state A if the RAS signal is deasserted. The LATCH signal and the counter enable (CEN) signal are deasserted at this time. This is shown at state line 670.

State D represents the Data Slot state in which addressed data locations are accessed and data is retrieved. The buffer controller of the page mode/nibble mode DRAM of the present invention will remain in the data slot stage for as long as the RAS signal is asserted and the CAS signal is deasserted, as indicated by state loop 680. This state loop indicates that the DRAM has actually accessed the memory storage cell. If, however, the RAS signal and CAS signal are both asserted, the buffer controller will move back to state C, as indicated by state line 685. Also, if the RAS signal deasserts the buffer controller will move to state A and deassert the LATCH signal and CEN signal, as shown by state line 690.

Figure 7:
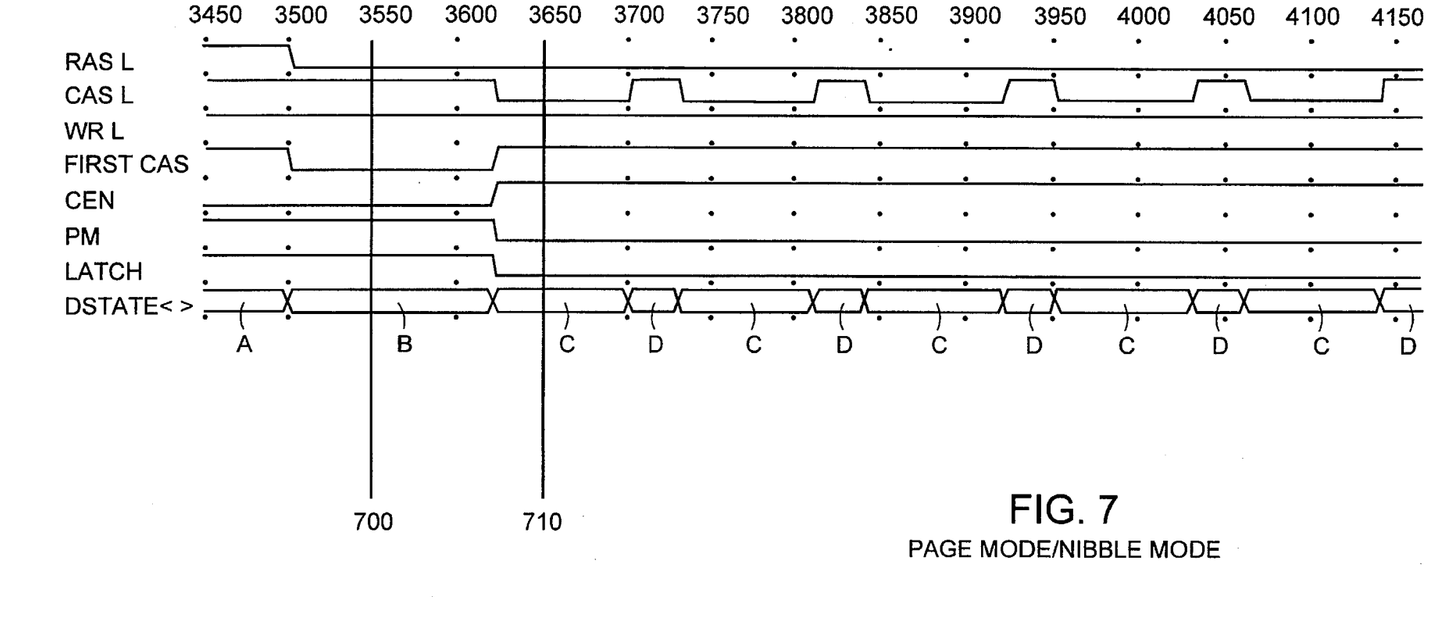
FIG. 7 is a timing diagram for a page mode/nibble mode DRAM of the present invention.

Reference is now made to FIG. 7. FIG. 7 shows a timing diagram for a page mode/nibble mode DRAM of the present invention.

The timing diagram of FIG. 7 depicts the signal states for each of the RAS, CAS, WE and CEN signal lines over time. For example, at time shown at 700, the RAS signal line, shown as RAS_L, (meaning RAS, assertion low) is asserted (logical low) whereas the CAS signal line shown as CAS_L, is deasserted (logical high). The WE signal line, WE_L, is also deasserted (logical high), meaning that the DRAM is in a read mode. At this time, the CEN signal line is logical low which indicates that the column address buffer counter 520 (see FIG. 5) is not enabled for counting. As such, the page mode/nibble mode DRAM is in the page mode.

FIG. 7 shows that page mode is the default mode for the page mode/nibble mode DRAM of the present invention. The output of the first flip flop 530 (see FIG. 5), which indicates whether the CAS signal that is received is the first CAS signal in a particular memory address cycle, will cause the DRAM to stay in page mode until the first CAS signal in another memory address cycle is again asserted.

At a later time, for example, at the time shown at 710, the RAS signal remains asserted (low), and the WE signal line remains deasserted (high). However, in this instance, the CAS signal indicates a change in state to an asserted state (low). As a result, the CEN signal changes to an asserted state (assertion high), placing the DRAM in nibble mode. The DRAM will remain in nibble mode until RAS is deasserted resetting the outputs of flip-flop 550 (see FIG. 5).

FIG. 7 also depicts the changes in the state of the buffer controller with changes in the signal states of, for example, the CAS signal. These state changes are shown along the timing line designated DSTATE, the states contained thereon corresponding to the states shown in FIG. 6.

Figure 7A:
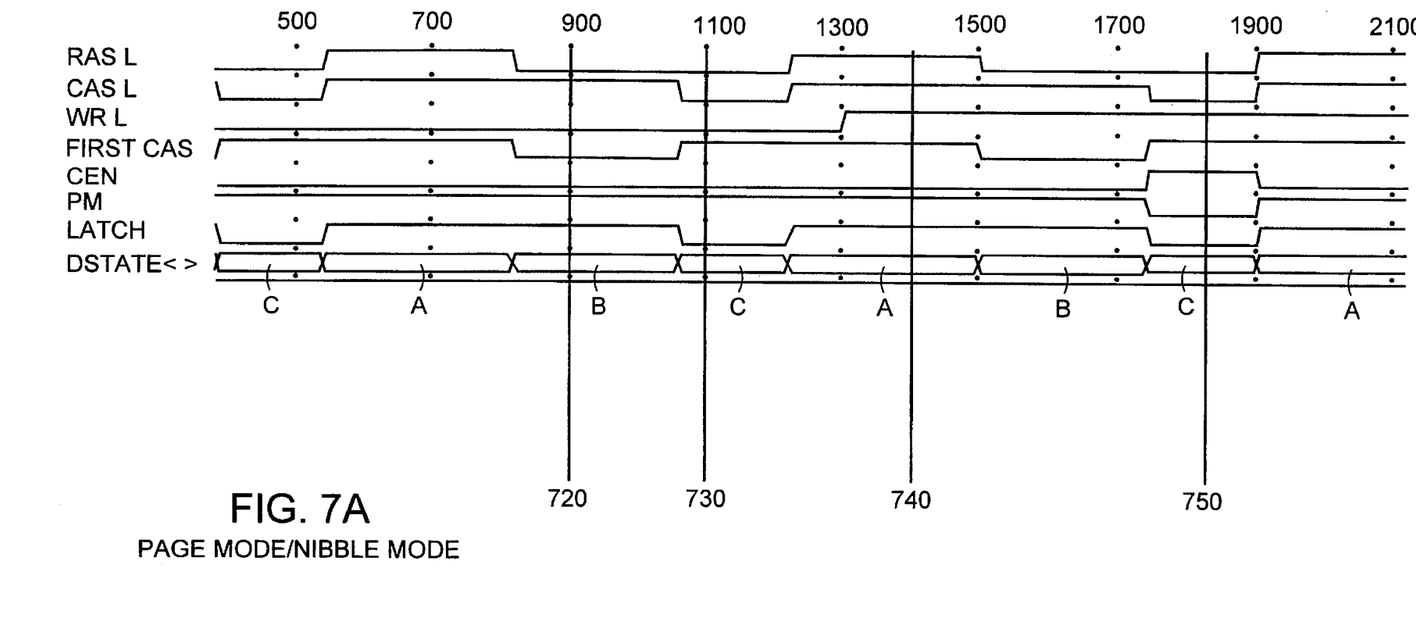
FIG. 7A is a timing diagram for a page mode/nibble mode DRAM with a write enable memory mode change.

Referring now to FIG. 7A, another timing diagram for the page mode/nibble mode DRAM of the present invention is shown. This diagram shows a change of DRAM from a page mode write to a nibble mode read. At time 720, RAS is asserted (low), CAS is deasserted (high) and WE (write enable) is asserted (low), meaning that the DRAM will be expected to move into a write mode. The CEN signal is also deasserted (low) meaning that the DRAM is presently in a page mode. Later, at time 730, even though the CAS signal changes state from deasserted (high) to asserted (low), and the output of the first flip flop 540 (see FIG. 5) also changes state from deasserted (low) to asserted (high), the DRAM remains in a page mode. Still later, at time 740, the RAS signal changes state from asserted (low) to deasserted (high), the CAS signal also deasserts (goes high) and the WE signal changes to become deasserted (high) indicating that the DRAM is in the page mode even though the WE (write enable) signal is deasserted. This is because the DRAM will not change from page mode to nibble mode until the next assertion of the CAS signal after the assertion of the RAS signal.

At time 750, the write enable (WE) signal remains deasserted (high) but the CAS assertion (low) has caused the CEN signal to assert (high) indicating a change to nibble mode.

What is claimed is:

1. A page mode/nibble mode dynamic random access memory (DRAM) for providing both a page mode and a nibble mode comprising:

a storage cell for storing information in an array defined by a predetermined number of rows and columns;

a row address decoder, coupled to said storage cell, the row address decoder receiving a first predetermined portion of a memory address and a first signal, said row address decoder inputting the first predetermined portion of the memory address into said storage cell in response to receiving the first signal;

a column address decoder, coupled to said storage cell, for receiving a second predetermined portion of the memory address and a second signal;

a column address buffer counter, coupled to the column address decoder and said storage cell, the column address buffer counter for receiving a third predetermined portion of the memory address and the second signal;

said column address decoder and said column address buffer counter inputting the second and third predetermined portions, respectively, of the memory address into said storage cell in response to receiving the second signal;

data-in and data-out buffers each coupled to said storage cell;

a write mode/read mode selection means coupled to said data-in and data-out buffers for receiving as an input a third signal with a state of the third signal determining whether a write mode is selected and whether a read mode is selected; and a buffer controller means, coupled to said column address decoder and said column address buffer counter, the buffer controller means for receiving at least the third signal as an input and for providing the second signal, with a state of the third signal determining whether a page mode or a nibble mode is selected, and wherein said page mode or said nibble mode is changeable during operation of said dynamic random access memory.

2. The page mode/nibble mode DRAM of claim 1, wherein said column address buffer counter increments said third predetermined portion of the memory address in response to each cycle of a fourth signal.

3. A page mode/nibble mode dynamic random access memory (DRAM) comprising:

a storage cell for storing information in an array defined by a predetermined number of rows and columnns;

a row address decoder, coupled to said storage cell, the row address decoder receiving a first predetermined portion of a memory address and a first signal, said row address decoder inputting the first predetermined portion of the memory address into said storage cell in response to receiving the first signal;

a column address decoder, coupled to said storage cell, for receiving a second predetermined portion of the memory address and a second signal;

a column address buffer counter, coupled to the column address decoder and said storage cell, the column address buffer counter for receiving a third predetermined portion of the memory address and the second signal, said column address buffer counter incrementing said third predetermined portion of the memory address in response to each cycle of a fourth signal;

said column address decoder and said column address buffer counter inputting the second and third predetermined portions, respectively, of the memory address into said storage cell in response to receiving the second signal;

data-in and data-out buffers each coupled to said storage cell;

a write mode/read mode selection means coupled to said data-in and data-out buffers for receiving as an input a third signal with a state of the third signal determining whether a write mode is selected and whether a read mode is selected; and a buffer controller means, coupled to said column address decoder and said column address buffer counter, the buffer controller means for receiving at least the third signal as an input and for providing the second signal, with a state of the third signal determining whether a page mode or a nibble mode is selected, said buffer controller means further including first state device having a predetermined signal and clocking signal input thereto, and an output, with the clocking signal being a fourth signal;

second state device having the third signal and a clocking signal input thereto, and a plurality of outputs, with the clocking input being the output of the first state device, said second state device having a first output that provides a fifth signal and a second output that provides a sixth signal with the fifth signal being input to the column address buffer counter;

said first and second state device each also receiving the first signal to clear said first and second state devices;

combining means for combining the fourth signal and the sixth signal, the combining means having a first output providing the second signal.

4. The page mode/nibble mode DRAM of claim 3, wherein said first and second state devices are "D" type flip-flops.

5. The page mode/nibble mode DRAM of claim 3, wherein a selection by said buffer controller means of a predetermined state of the fifth signal indicates a nibble mode for said DRAM.

6. The page mode/nibble mode DRAM of claim 3, wherein a selection by said buffer controller means of a predetermined state of the sixth signal indicates a page mode for said DRAM.

7. The page mode/nibble mode DRAM of claim 3, wherein said combining means comprises an AND gate.

8. The page mode/nibble mode DRAM of claim 3, wherein the first output of the combining means is a LATCH signal.

9. A method of operating a dynamic random access memory (DRAM) having at least a storage cell, a column address decoder, and a column address buffer counter, the method comprising the steps of:

sending a memory address having at least first, second and third predetermined portions corresponding to a row address, a first portion of a column address, and a second portion of the column address respectively, to the row address decoder, column address decoder, and column address buffer counter;

strobing the first predetermined portion of the memory address into the row address decoder in response to a first signal;

strobing the second predetermined portion of the memory address into the column address decoder in response to a second signal;

strobing the third predetermined portion of the memory address into the column address buffer counter in response to the second signal;

selecting a location in the storage cell corresponding to the first, second and third predetermined portions of the memory address;

receiving, in the DRAM, a write enable signal and providing the second signal in response thereto;

selecting a first mode of operation for the DRAM, such that if the write enable signal has a first predetermined state, the DRAM operates in a read mode, and if the write enable signal has a complementary state the DRAM operates in a write mode; and selecting a page mode of operation for the DRAM if the write enable signal has a first predetermined state, and a nibble mode of operation for the DRAM if the write enable signal has a second predetermined state, wherein said page mode or said nibble mode is changeable during operation of said dynamic random access memory.

10. The method of claim 9, wherein the step of selecting a page mode of operation for the DRAM if the write enable signal has a first predetermined state, and selecting a nibble mode of operation for the DRAM if the write enable signal has a second predetermined state, further comprises the steps of:

sending at least the first signal, the write enable signal, and a third signal to a buffer controller device; and outputting from the buffer controller device, the second signal and nibble mode and page mode control signals in a predetermined dependence upon the first, third and write enable signals.

* * * * *